United States Patent
Song et al.

(10) Patent No.: US 11,770,942 B2
(45) Date of Patent: Sep. 26, 2023

(54) DISPLAY APPARATUS

(71) Applicant: Samsung Display Co., Ltd., Yongin-si (KR)

(72) Inventors: Jungbae Song, Yongin-si (KR); Joosun Yoon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 312 days.

(21) Appl. No.: 16/950,777

(22) Filed: Nov. 17, 2020

(65) Prior Publication Data

US 2021/0336172 A1 Oct. 28, 2021

(30) Foreign Application Priority Data

Apr. 28, 2020 (KR) ........................ 10-2020-0051827

(51) Int. Cl.
*H01L 31/0232* (2014.01)
*H10K 50/115* (2023.01)
*H10K 59/38* (2023.01)

(52) U.S. Cl.
CPC ........... *H10K 50/115* (2023.02); *H10K 59/38* (2023.02)

(58) Field of Classification Search
CPC ..... H01L 25/048; H01L 25/167; H01L 27/15; H01L 27/288; H01L 27/32; H01L 51/0032; H01L 51/05; H01L 51/00; H01L 51/502; H01L 27/322; H01L 27/3244; H01L 51/504; H01L 51/5278; H01L 51/5284; H01L 2251/5369; H01L 27/3211; H01L 51/5036; G02B 5/201; G02B 5/206; H10K 50/115; H10K 59/38; H10K 50/13; H10K 50/19; H10K 50/865; H10K 59/12; H10K 2102/331; H10K 50/125; H10K 59/35

See application file for complete search history.

(56) References Cited

U.S. PATENT DOCUMENTS 8,395,308 B2 3/2013 Asaki
9,698,311 B2 7/2017 Greco et al.
(Continued)

FOREIGN PATENT DOCUMENTS

CN 112310300 A * 2/2021 ......... H01L 25/0753
KR 10-2014-0121351 A 10/2014
(Continued)

*Primary Examiner* — Samuel Park
(74) *Attorney, Agent, or Firm* — Lewis Roca Rothgerber Christie LLP

(57) ABSTRACT

A display apparatus is provided and including: first to third light-emitting devices arranged on a lower substrate; an upper substrate including a first emission area corresponding to the first light-emitting device, a second emission area corresponding to the second light-emitting device, a third emission area corresponding to the third light-emitting device, and a non-emission area; a first insulating layer arranged on the upper substrate and having a first opening corresponding to the first emission area, a second opening corresponding to the second emission area, and a first auxiliary opening corresponding to the non-emission area and located relative to the first opening in a first direction; and a second insulating layer arranged on the first insulating layer and having a first open portion corresponding to the first opening and the first auxiliary opening.

20 Claims, 12 Drawing Sheets

(56) References Cited

U.S. PATENT DOCUMENTS

| | | | |
|---|---|---|---|
| 10,466,530 B2 | 11/2019 | Lee et al. | |
| 10,593,901 B2 | 3/2020 | Holloway et al. | |
| 2010/0007632 A1* | 1/2010 | Yamazaki | H01L 27/3234 |
| | | | 345/175 |
| 2018/0179441 A1 | 6/2018 | Park et al. | |
| 2019/0393297 A1* | 12/2019 | Kung | H01L 23/3171 |
| 2021/0028327 A1* | 1/2021 | Lin | H01L 33/0095 |
| 2021/0098350 A1* | 4/2021 | Cheah | H01L 23/49833 |

FOREIGN PATENT DOCUMENTS

| | | |
|---|---|---|
| KR | 10-1768104 B1 | 8/2017 |
| KR | 10-2018-0013980 A | 2/2018 |
| KR | 10-2018-0077086 A | 7/2018 |
| KR | 10-2018-0101302 A | 9/2018 |
| KR | 10-2019-0016631 A | 2/2019 |
| KR | 10-2056020 B1 | 12/2019 |

* cited by examiner

DISPLAY APPARATUS

CROSS-REFERENCE TO RELATED APPLICATION

This application claims priority to and the benefit of Korean Patent Application No. 10-2020-0051827, filed on Apr. 28, 2020, the entire disclosure of which is hereby incorporated by reference.

BACKGROUND

1. Field

One or more embodiments relate to a display apparatus, and more particularly, to a display apparatus having improved reflected color formed by external light.

2. Description of Related Art

Display apparatuses are apparatuses that visually display data. Display apparatuses may be utilized as displays for small products such as mobile phones, or may be utilized as displays for large products such as televisions.

Display apparatuses include a plurality of pixels that receive electrical signals and are to emit light to display images to the outside. Each pixel includes a light-emitting device. For example, in the case of organic light-emitting display apparatuses, each pixel includes an organic light-emitting diode (OLED) as a light-emitting device. In general, organic light-emitting display apparatuses operate with a thin-film transistor and an organic light-emitting diode formed on a substrate, and the organic light-emitting diode emits light as a direct light emitting source.

Recently, the usage of display apparatuses has diversified, and thus, various suitable designs for enhancing the quality of display apparatuses have been attempted.

SUMMARY

However, in display apparatuses of the related art, a color of reflected light formed by external light on the display apparatuses when the display apparatuses are not driven is tinged with (into) blue rather than black.

One or more embodiments relate to a display apparatus having improved color of reflected light formed by external light that travels after being reflected by the display apparatus. However, this is merely an example, and the scope of the disclosure is not limited thereby.

Additional aspects will be set forth in part in the description which follows and, in part, will be apparent from the description, or may be learned by practice of the presented embodiments.

According to one or more embodiments, a display apparatus includes a first light-emitting device, a second light-emitting device, and a third light-emitting device arranged on a lower substrate, an upper substrate arranged to face the lower substrate and including a first emission area corresponding to the first light-emitting device, a second emission area corresponding to the second light-emitting device, a third emission area corresponding to the third light-emitting device, and a non-emission area, which is an area of the upper substrate other than the first to third emission areas, a first insulating layer arranged on the upper substrate and having a first opening corresponding to the first emission area, a second opening corresponding to the second emission area, and a first auxiliary opening corresponding to the non-emission area and located relative to the first opening in a first direction, a first color conversion layer arranged in the first opening and including first quantum dots to convert incident light into light of a first color, a first auxiliary color conversion layer arranged in the first auxiliary opening and including the first quantum dots to convert incident light into light of the first color, and a second insulating layer arranged on the first insulating layer and having a first open portion corresponding to the first opening and the first auxiliary opening.

According to an embodiment, the display apparatus may further include a transmission layer arranged in the second opening, wherein the second insulating layer may further have a second open portion that corresponds to the second opening and has an extension portion extending in a second direction and exposing at least a portion of the first insulating layer, the second direction being opposite to the first direction.

According to an embodiment, the display apparatus may further include a second color conversion layer arranged to correspond to the third emission area and including second quantum dots to convert incident light into light of a second color, and a second auxiliary color conversion layer arranged to correspond to the non-emission area and including the second quantum dots to convert incident light into light of the second color, wherein the first insulating layer may further have a third opening and a second auxiliary opening, the third opening corresponding to the third emission area and having the second color conversion layer located therein, and the second auxiliary opening corresponding to the non-emission area, being located relative to the third opening in the first direction, and having the second auxiliary color conversion layer located therein, and the second insulating layer may further have a third open portion corresponding to the third opening and the second auxiliary opening.

According to an embodiment, a size of the first opening and a size of the third opening may be smaller than a size of the second opening.

According to an embodiment, the second opening may be arranged between the first auxiliary opening and the second auxiliary opening.

According to an embodiment, the first color may be red, and the second color may be green.

According to an embodiment, the display apparatus may further include a first filter layer between the upper substrate and the first color conversion layer, and a first auxiliary filter layer between the upper substrate and the first auxiliary color conversion layer.

According to an embodiment, a surface of the first insulating layer exposed by the first open portion may have hydrophobicity.

According to an embodiment, at least one selected from among the first insulating layer and the second insulating layer may be black or blue.

According to an embodiment, on a plane, the first to third openings may each have a square shape.

According to an embodiment, extension lines coupling a center of one of the first to third openings to centers of the other two of the first to third openings, respectively, may cross each other.

According to an embodiment, the first to third light-emitting devices may emit light in which blue light and green light are mixed.

According to one or more embodiments, a display apparatus includes a first light-emitting device, a second light-emitting device, and a third light-emitting device arranged on a lower substrate, an upper substrate arranged to face the lower substrate and including a first emission area corresponding to the first light-emitting device, a second emission area corresponding to the second light-emitting device, a third emission area corresponding to the third light-emitting device, and a non-emission area, which is an area of the upper substrate other than the first to third emission areas, a first insulating layer arranged on the upper substrate and having a first opening corresponding to the first emission area and a second opening corresponding to the second emission area, a first color conversion layer arranged in the first opening and including first quantum dots to convert incident light into light of a first color, and a second insulating layer arranged on the first insulating layer and having a first open portion corresponding to the first opening, wherein the first opening has a first auxiliary extension portion extending toward the non-emission area along a first direction, and the first open portion has a first extension portion extending toward the non-emission area along the first direction.

According to an embodiment, the display apparatus may further include a transmission layer arranged in the second opening, wherein the second insulating layer may further have a second open portion that corresponds to the second opening and has a second extension portion extending in a second direction and exposing at least a portion of the first insulating layer, the second direction being opposite to the first direction.

According to an embodiment, on a plane, the second opening may have a square shape.

According to an embodiment, the display apparatus may further include a second color conversion layer arranged to correspond to the third emission area and including second quantum dots to convert incident light into light of a second color, wherein the first insulating layer may further have a third opening corresponding to the third emission area and having the second color conversion layer located therein, the second insulating layer may further have a third open portion corresponding to the third opening, and the third opening may have a second auxiliary extension portion extending toward the non-emission area along the first direction, and the third open portion may have a third extension portion extending toward the non-emission area along the first direction.

According to an embodiment, the display apparatus may further include a first filter layer between the upper substrate and the first color conversion layer, a second filter layer between the upper substrate and the transmission layer, and a third filter layer between the upper substrate and the second color conversion layer.

According to an embodiment, the second opening may be arranged between the first auxiliary extension portion of the first opening and the second auxiliary extension portion of the third opening.

According to an embodiment, the first to third light-emitting devices may emit light in which blue light and green light are mixed.

According to an embodiment, on a plane, the first opening may have an "L" shape.

Other aspects and features of the disclosure will become more apparent through the accompanying drawings, the claims and the detailed description.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
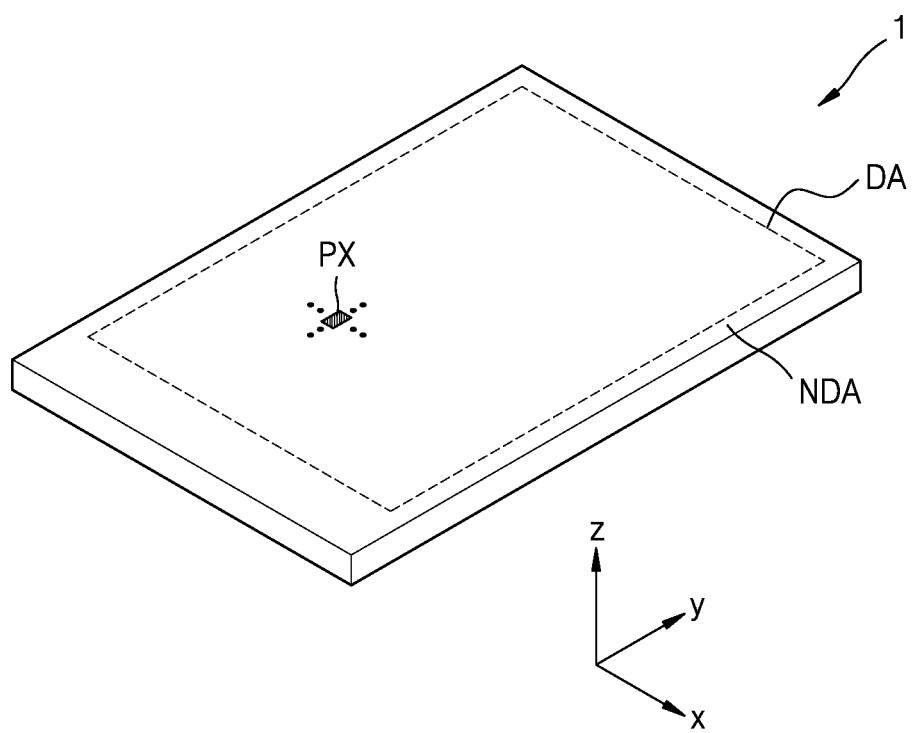
FIG. 1 is a schematic perspective view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various suitable modifications may be applied to the present embodiments, and some embodiments will be illustrated in the drawings and described in the detailed description section. The aspects and features of the present embodiments, and a method to achieve the same will become more apparent from the following embodiments that are described in more detail in conjunction with the accompanying drawings. However, the present specification is not limited to the following embodiments and may be embodied in various suitable forms.

The present embodiments will now be described more fully with reference to the accompanying drawings. When describing embodiments with reference to the accompanying drawings, the same or corresponding elements are denoted by the same reference numerals and a redundant description thereof may not be repeated.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be understood that the terms "comprises" and "comprising," as used herein, specify the presence of stated features and/or elements, but do not preclude the presence or addition of one or more other features and/or elements.

It will be understood that when a layer, region, or element is referred to as being connected to another layer(s), region(s), or element(s), it can be directly connected to the other layer(s), region(s), or element(s) or indirectly connected to the other layer(s), region(s), or element(s) via one or more intervening layers, regions, or elements.

Sizes of elements in the drawings may be exaggerated for convenience of description. For example, because the sizes and thicknesses of elements in the drawings may be exaggerated for convenience of description, the present disclosure is not limited thereto.

When an embodiment may be implemented differently, a process order may be performed differently from the described order. For example, two consecutively described processes may be performed substantially at the same time or performed in an order opposite to the described order.

In the present specification, the expression "A and/or B" indicates only A, only B, or both A and B. The expression "at least one of A or B" indicates only A, only B, or both A and B.

In the following embodiments, when a layer, region, or element is referred to as being connected to another layer(s), region(s), or element(s), it can be directly connected to the other layer(s), region(s), or element(s) or indirectly connected to the other layer(s), region(s), or element(s) via one or more intervening layers, regions, or elements. For example, in the present specification, when a layer, region, or element is referred to as being electrically connected to another layer(s), region(s), or element(s), it can be directly electrically connected to the other layer(s), region(s), or element(s) or indirectly electrically connected to the other layer(s), region(s), or element(s) via one or more intervening layers, regions, or elements.

The x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a schematic perspective view of a display apparatus 1 according to an embodiment.

Referring to FIG. 1, the display apparatus 1 may include a display area DA in which an image is to be displayed and a non-display area NDA in which no image is to be implemented (e.g., displayed). The display apparatus 1 may provide an image to the outside by utilizing light emitted from the display area DA.

The display apparatus 1 having a rectangular display area DA is shown in FIG. 1, but the present disclosure is not limited thereto. A shape of the display area DA may be any suitably shape, such as a circle, an ellipse, or a polygon such as a triangle or a pentagon. In addition, though a flat-panel display apparatus is shown in FIG. 1, the display apparatus 1 may be implemented in various suitable forms, such as a flexible, foldable, and/or rollable display apparatus.

Though an organic light-emitting display apparatus is described as an example of the display apparatus 1 according to an embodiment, the present disclosure is not limited thereto. For example, in another embodiment, the display apparatus 1 may be an inorganic light-emitting display, an inorganic electroluminescence (EL) display, or a quantum dot light-emitting display. For example, an emission layer of a display element provided in the display apparatus 1 may include (e.g., be) an organic material; an inorganic material; quantum dots; an organic material and quantum dots; an inorganic material and quantum dots; or an organic material, an inorganic material, and quantum dots.

A plurality of pixels PX may be arranged in the display area DA. Hereinafter, in the present specification, the pixels PX refer to sub-pixels that emit light of different colors, and the pixels PX may each be, for example, one of a red (R) sub-pixel, a green (G) sub-pixel, and a blue (B) sub-pixel.

Figure 2:
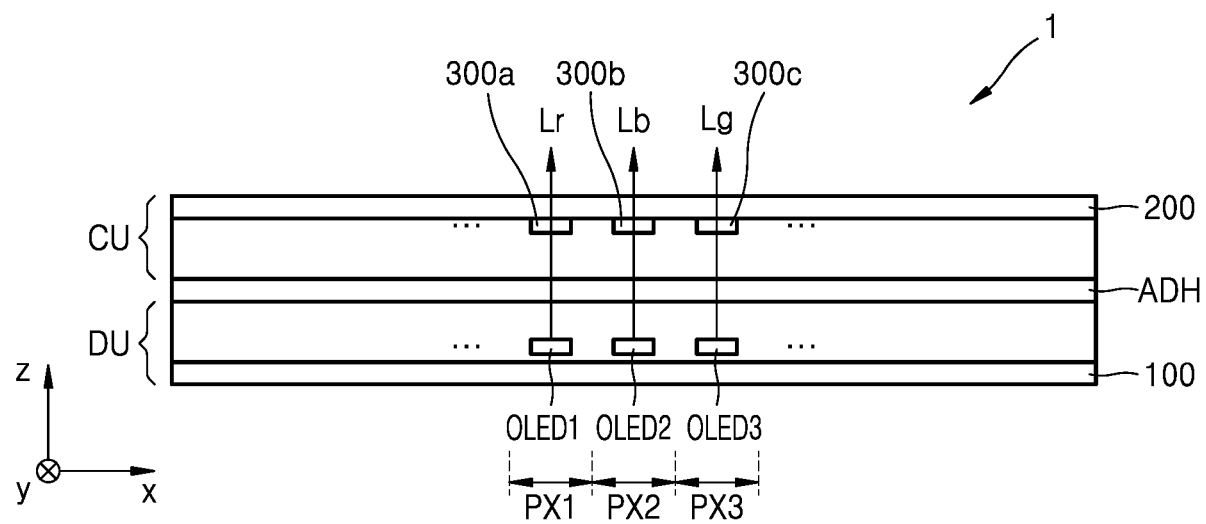
FIG. 2 is a schematic cross-sectional view of a display apparatus according to an embodiment.

FIG. 2 is a schematic cross-sectional view of a display apparatus 1 according to an embodiment.

Referring to FIG. 2, the display apparatus 1 may include a display unit DU, and a color filter unit CU arranged to face (e.g., arranged on, above, or to overlap) the display unit DU. The display unit DU may include a first pixel PX1, a second pixel PX2, and a third pixel PX3, which are arranged on a lower substrate 100. The first to third pixels PX1 to PX3 may be pixels that emit light of different colors on the lower substrate 100, respectively. For example, the first pixel PX1 may emit red light Lr, the second pixel PX2 may emit blue light Lb, and the third pixel PX3 may emit green light Lg.

The first to third pixels PX1 to PX3 may include a first light-emitting device OLED1, a second light-emitting device OLED2, and a third light-emitting device OLED3, respectively. The first to third light-emitting devices OLED1 to OLED3 may each include an organic light-emitting diode (OLED). In an embodiment, the first to third light-emitting devices OLED1 to OLED3 may emit blue light Lb. In another embodiment, the first to third light-emitting devices OLED1 to OLED3 may emit red light Lr, blue light Lb, and green light Lg, respectively. In another embodiment, the first to third light-emitting devices OLED1 to OLED3 may emit light in which blue light Lb and green light Lg are mixed. This will be described in more detail in FIG. 3.

The color filter unit CU may include a first filter 300a, a second filter 300b, and a third filter 300c. The light emitted from the first to third light-emitting devices OLED1 to OLED3 may be emitted as red light Lr, blue light Lb, and green light Lg through the first to third filters 300a to 300c, respectively. For example, light emitted from the first to third light-emitting devices OLED1 to OLED3 that respectively passes through the first to third filters 300a to 300c may be converted to, and/or filtered as, red light Lr, blue light Lb, and green light Lg, respectively.

The first to third filters 300a to 300c may be located directly on an upper substrate 200. The first to third filters 300a to 300c may include a first color conversion layer 220a and a first filter layer 210a, a transmission layer 220b and a second filter layer 210b, and a second color conversion layer 220c and a third filter layer 210c, shown in FIGS. 3 and 4 to be described in more detail later, respectively.

In this case, the phrase "located directly on an upper substrate 200" means that the first to third filter layers 210a to 210c are formed directly on the upper substrate 200 to manufacture (e.g., during the manufacture of) the color filter unit CU. Thereafter, the first to third filter layers 210a to 210c may be arranged to face the first to third pixels PX1 to PX3, respectively, and thus, the display unit DU and the color filter unit CU may be bonded to each other.

In FIG. 2, it is shown that the display unit DU and the color filter unit CU are bonded to each other through an adhesive layer ADH. The adhesive layer ADH may be, for example, an optical clear adhesive (OCA), but is not limited thereto. In another embodiment, the adhesive layer ADH may be omitted.

Figure 3:
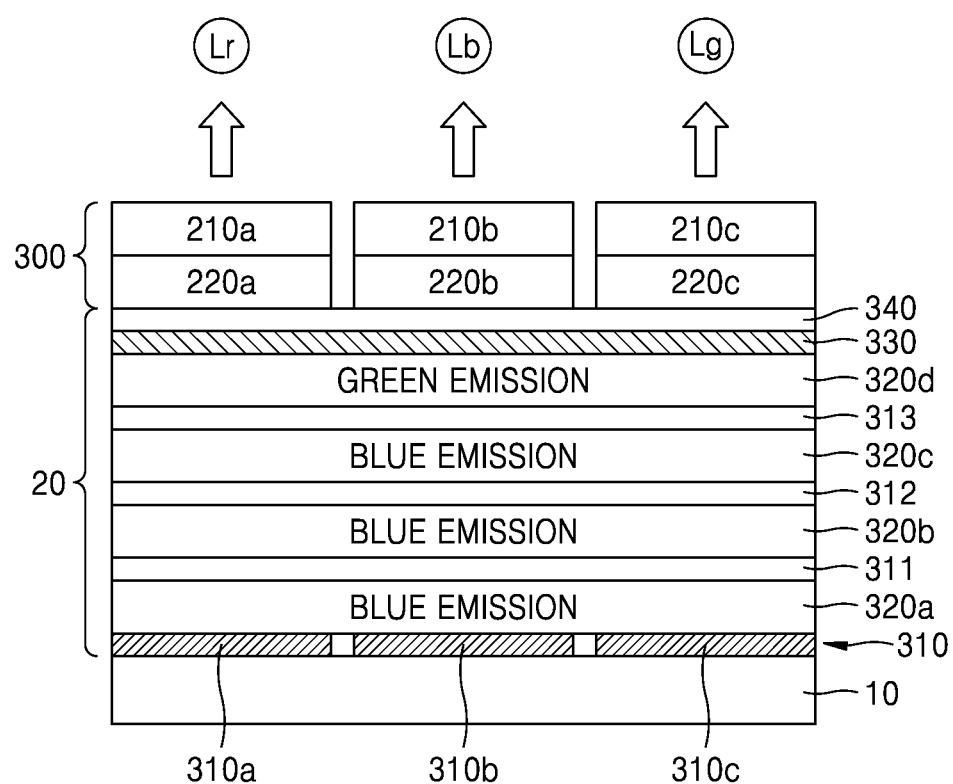
FIG. 3 is an enlarged view of a portion of a display apparatus according to an embodiment.

FIG. 3 is an enlarged view of a portion of a display apparatus 1 according to an embodiment.

Referring to FIG. 3, the display apparatus 1 (see FIG. 1) may include a thin-film transistor array substrate 10 including a plurality of thin-film transistors TFT (see FIG. 11), and an OLED substrate 20 may be provided on the thin-film transistor array substrate 10. The OLED substrate 20 may be referred to as a light source OLED. The thin-film transistors TFT of the thin-film transistor array substrate 10 may be devices for driving pixel (e.g., sub-pixel) areas of the OLED substrate 20. A filter 300 may be provided on the OLED substrate 20.

The OLED substrate 20 may include a plurality of pixel electrodes 310 (e.g. 310a, 310b, and 310c). The pixel electrodes 310a, 310b, and 310c may be elements patterned to correspond to respective sub-pixel areas. Each of the pixel electrodes 310a, 310b, and 310c may be electrically coupled (e.g., connected) to each (e.g., to a respective) thin-film transistor TFT of the thin-film transistor array substrate 10. A first blue emission unit 320a, a second blue emission unit 320b, a third blue emission unit 320c, and a green emission unit 320d may be sequentially stacked on the pixel electrodes 310a, 310b, and 310c. Though it is shown in FIG. 3 that the first blue emission unit 320a, the second blue emission unit 320b, the third blue emission unit 320c, and the green emission unit 320d are sequentially stacked on the pixel electrodes 310a, 310b, and 310c, the green emission unit 320d may be arranged between the first blue emission unit 320a and the second blue emission unit 320b, or between the second blue emission unit 320b and the third blue emission unit 320c. As an example, the first blue emission unit 320a, the second blue emission unit 320b, the green emission unit 320d, and the third blue emission unit 320c may be sequentially stacked on the pixel electrodes 310a, 310b, and 310c.

The first blue emission unit 320a, the second blue emission unit 320b, and the third blue emission unit 320c may each include a blue emission layer including (e.g., being) an organic material-based blue emission material and may each further include a hole transport layer (HTL) and/or an electron transport layer (ETL). The green emission unit 320d may include a green emission layer including (e.g., being) an organic material-based green emission material and may further include (e.g., be) an HTL and/or an ETL.

A first charge generation layer 311 may be provided between the first blue emission unit 320a and the second blue emission unit 320b. In addition, a second charge generation layer 312 may be provided between the second blue emission unit 320b and the third blue emission unit 320c, and a third charge generation layer 313 may be provided between the third blue emission unit 320c and the green emission unit 320d. For example, in some embodiments, the first blue emission unit 320a, the second blue emission unit 320b, the third blue emission unit 320c, and the green emission unit 320d are coupled (e.g., connected) to each other in series to form a tandem structure. The first charge generation layer 311, the second charge generation layer 312, and the third charge generation layer 313 may include (e.g., be) metal and/or a metallic material and may increase the emission efficiency of the OLED substrate 20.

An opposite electrode 330 may be provided on the green emission unit 320d. Here, though the opposite electrode 330 is shown in an unpatterned form (e.g., a continuous or integral form), in some cases, the opposite electrode 330 may be patterned as a plurality of electrode elements. For example, in some embodiments the opposite electrode 330 may be a common electrode that corresponds to multiple subpixels, and in some embodiments the opposite electrode 330 may be provided in plurality to correspond to individual subpixels. In addition, the first blue emission unit 320a, the second blue emission unit 320b, the third blue emission unit 320c, and the green emission unit 320d located between the pixel electrode 310 and the opposite electrode 330, and the first to third charge generation layers 311 to 313 therebetween may have a structure patterned in units of sub-pixels. A set or predetermined protective layer 340 may be further provided on the opposite electrode 330. The protective layer 340 may include (e.g., be) a transparent insulating material.

The first color conversion layer 220a, the transmission layer 220b, and the second color conversion layer 220c may be arranged on the protective layer 340. In addition, the first filter layer 210a may be arranged on the first color conversion layer 220a, the second filter layer 210b may be arranged on the transmission layer 220b, and the third filter layer 210c may be arranged on the second color conversion layer 220c.

In an embodiment, the first color conversion layer 220a and the second color conversion layer 220c may include (e.g., be) quantum dot materials. The core of quantum dots may be selected from among a II-VI compound, a III-V compound, a IV-VI compound, a IV element, a IV compound, and a combination thereof.

The II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof, a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The III-VI compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof, and a quaternary compound selected from the group consisting of GaAlNAs, GaAlNP, GaAlNSb, GaAlPAs, GaAlPSb, GaInNP, GaInNAs, GaInNSb, GaIn-PAs, GaInPSb, InAlNP, InAlNAs, InAlNSb, InAlPAs, InAlPSb, and a mixture thereof.

The IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The IV element may be selected from the group consisting of silicon (Si), germanium (Ge), and a mixture thereof. The IV compound may be a binary compound selected from the group consisting of SiC, SiGe, and a mixture thereof.

In this case, the binary compound, the ternary compound, or the quaternary compound may be present in a particle (e.g., a quantum dot) at a uniform concentration or may be present in the same particle (e.g., quantum dot) as the concentration distribution is divided into partially different states. In addition, the quantum dots may have a core-shell structure in which one quantum dot surrounds another quantum dot. An interface between a core and a shell may have a concentration gradient in which a concentration of an element present in the shell decreases toward a center of the quantum dot.

In some embodiments, the quantum dots may have a core-shell structure including a core including nanocrystals and a shell surrounding the core. The shell of the quantum dot may function as a protective layer for maintaining semiconductor characteristics by preventing or reducing chemical transformation of the core and/or as a charging layer for imparting electrophoretic characteristics to the quantum dots. The shell may include a single layer or a multi-layer. Examples of the shell of the quantum dot may include (e.g., be) a metal or non-metal oxide, a semiconductor compound, or a combination thereof.

For example, the metal or non-metal oxide may be exampled as a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, etc. or a ternary compound such as $MgAl_2O_4$, $CoFe_2O_4$, $NiFe_2O_4$, $CoMn_2O_4$, etc., but the present disclosure is not limited thereto.

In addition, the semiconductor compound may be exampled as CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the present disclosure is not limited thereto.

The quantum dots may have a full width of half maximum (FWHM) of an emission wavelength spectrum of about 45 nm or less, preferably about 40 nm or less, and more preferably about 30 nm or less. As used herein, the term nm may refer to a distance equal to $10^{-9}$ meters. Color purity and/or color reproducibility may be improved within this range. In addition, light emitted through the quantum dots is emitted in all directions, and thus, an optical field of view may be improved.

In addition, forms of the quantum dots are not limited to forms generally used or generally available in the related art. In some embodiments, the quantum dots may have forms of spherical, pyramidal, multi-arm, or cubic nanoparticles, nanotubes, nanowires, nanofibers, or nanoplate-shaped particles.

The quantum dots may adjust a color of emitted light according to a particle size, and thus, the quantum dots may have various suitable emission colors such as blue, red, green, etc.

The first filter layer 210a may transmit only light having a wavelength of about 630 nm to about 780 nm, the second filter layer 210b may transmit only light having a wavelength of about 450 nm to about 495 nm, and the third filter layer 210c may transmit only light having a wavelength of about 495 nm to about 570 nm. For example, the first to third filter layers 210a to 210c may include a red color filter, a blue color filter, and a green color filter, respectively. The light transmitted through the first to third filter layers 210a to 210c may have improved reproducibility of red, blue, and green colors, respectively. In addition, the first to third filter layers 210a to 210c may serve to reduce external light reflection in the display apparatus 1.

Figure 4:
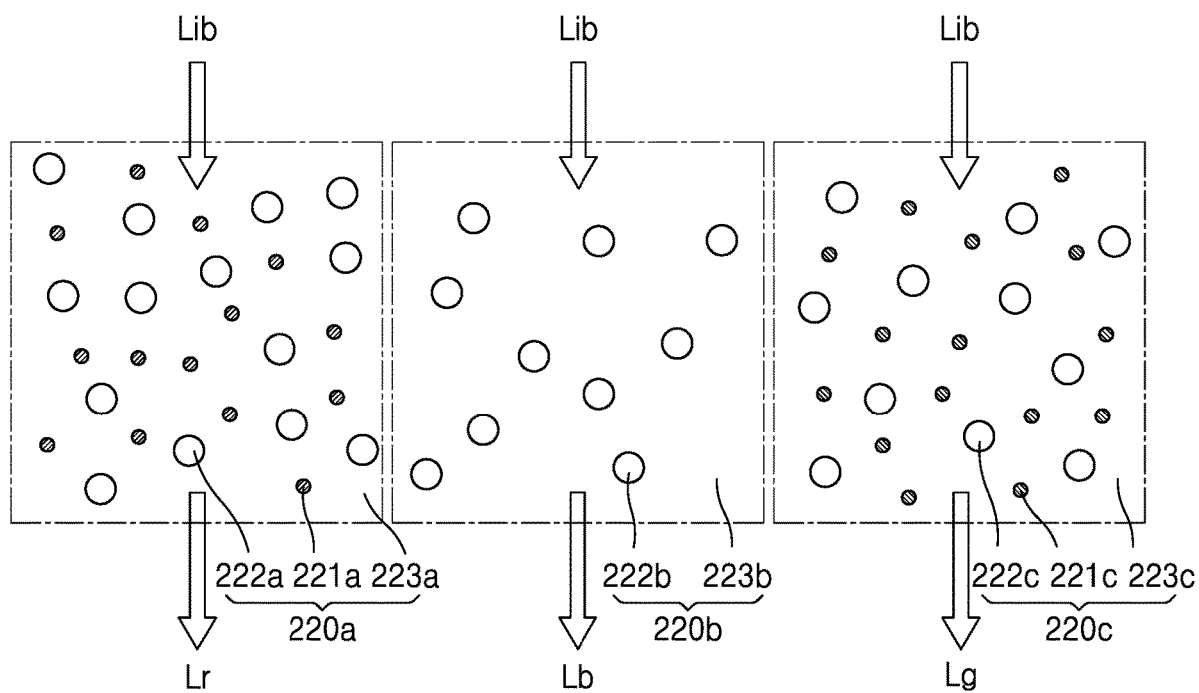
FIG. 4 is an enlarged view of a portion of a display apparatus according to an embodiment.

FIG. 4 is an enlarged view of a portion of a display apparatus 1 according to an embodiment.

Referring to FIG. 4, the first color conversion layer 220a may convert blue incident light Lib into a light Lr of a first color (e.g., red). The first color conversion layer 220a may include (e.g., be) a first photosensitive polymer 223a in which first quantum dots 221a and first scattering particles 222a are dispersed.

The first quantum dots 221a may be excited by the blue incident light Lib to isotropically emit the light Lr of the first color having a wavelength longer than a wavelength of blue light. The first photosensitive polymer 223a may include (e.g., be) an organic material having light transmission properties. The first scattering particles 222a may scatter the blue incident light Lib, which is not absorbed by the first quantum dots 221a, to cause more first quantum dots 221a to be excited, thereby increasing a color conversion rate of the first color conversion layer 220a. The first scattering particles 222a may include (e.g., be), for example, titanium oxide ($TiO_2$) and/or metal particles.

The transmission layer 220b may transmit the blue incident light Lib and emit the blue incident light Lib in a direction of (e.g., in a direction toward) the upper substrate 200. The transmission layer 220b may include (e.g., be) a second photosensitive polymer 223b in which second scattering particles 222b are dispersed. The second photosensitive polymer 223b may include (e.g., be), for example, an organic material having light transmission properties, such as silicone resin and/or epoxy resin, and may include (e.g., be) the same material as the first photosensitive polymer 223a. The second scattering particles 222b may scatter and emit the blue incident light Lib and may include (e.g., be) the same material as the first scattering particles 222a.

The second color conversion layer 220c may convert the blue incident light Lib into light Lg of a second color (e.g., green). The second color conversion layer 220c may include (e.g., be) a third photosensitive polymer 223c in which second quantum dots 221c and third scattering particles 222c are dispersed.

The second quantum dots 221c may be excited by the blue incident light Lib to isotropically emit the light Lg of the second color having a wavelength longer than the wavelength of the blue light. The third photosensitive polymer 223c may include (e.g., be) an organic material having light transmission properties and may include (e.g., be) the same material as the first photosensitive polymer 223a and the second photosensitive polymer 223b. The third scattering particles 222c may scatter the blue incident light Lib, which is not absorbed by the second quantum dots 221c, to cause more second quantum dots 221c to be excited, thereby increasing a color conversion rate of the second color conversion layer 220c. The third scattering particles 222c may include (e.g., be), for example, titanium oxide ($TiO_2$) and/or metal particles and may include (e.g., be) the same material as the first scattering particles 222a and the second scattering particles 222b.

Figure 5:
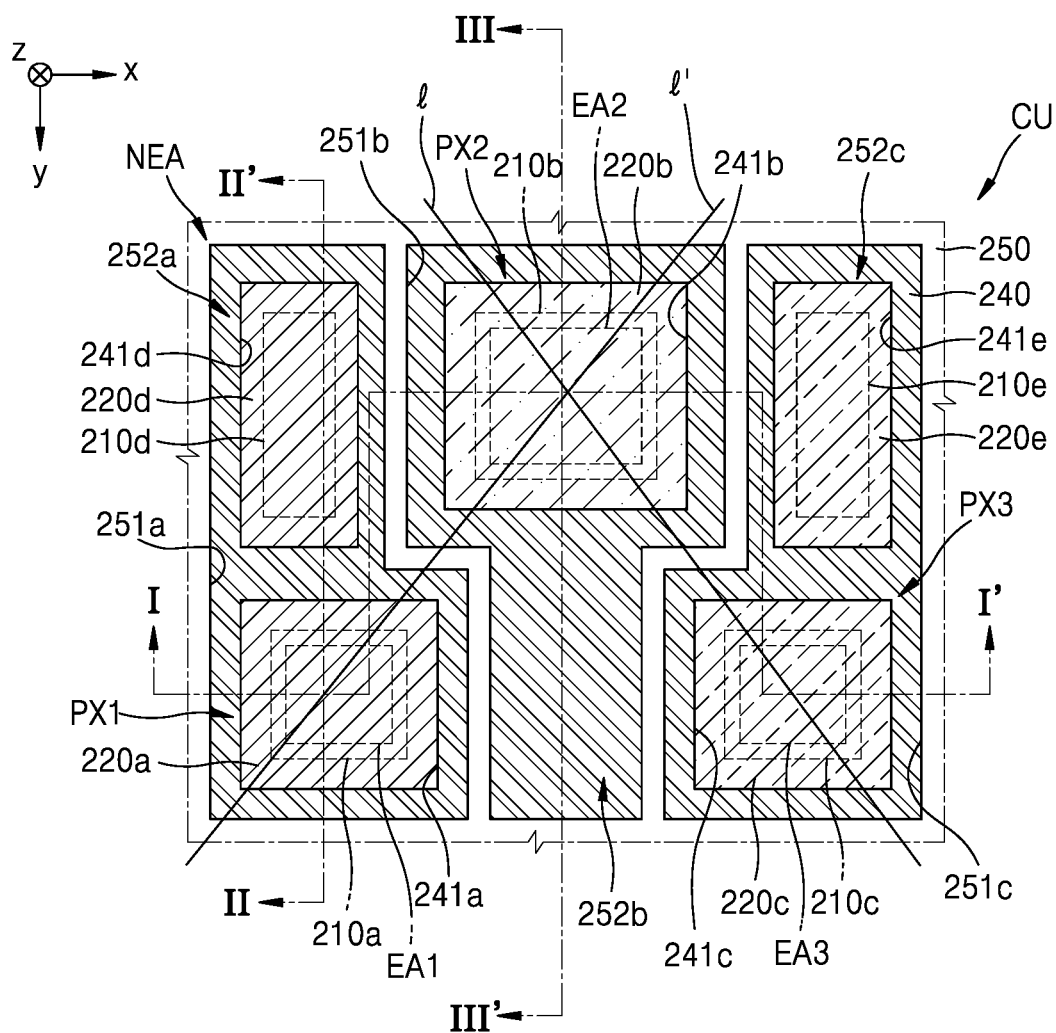
FIG. 5 is a schematic plan view of a color filter unit according to an embodiment.
Figure 6:
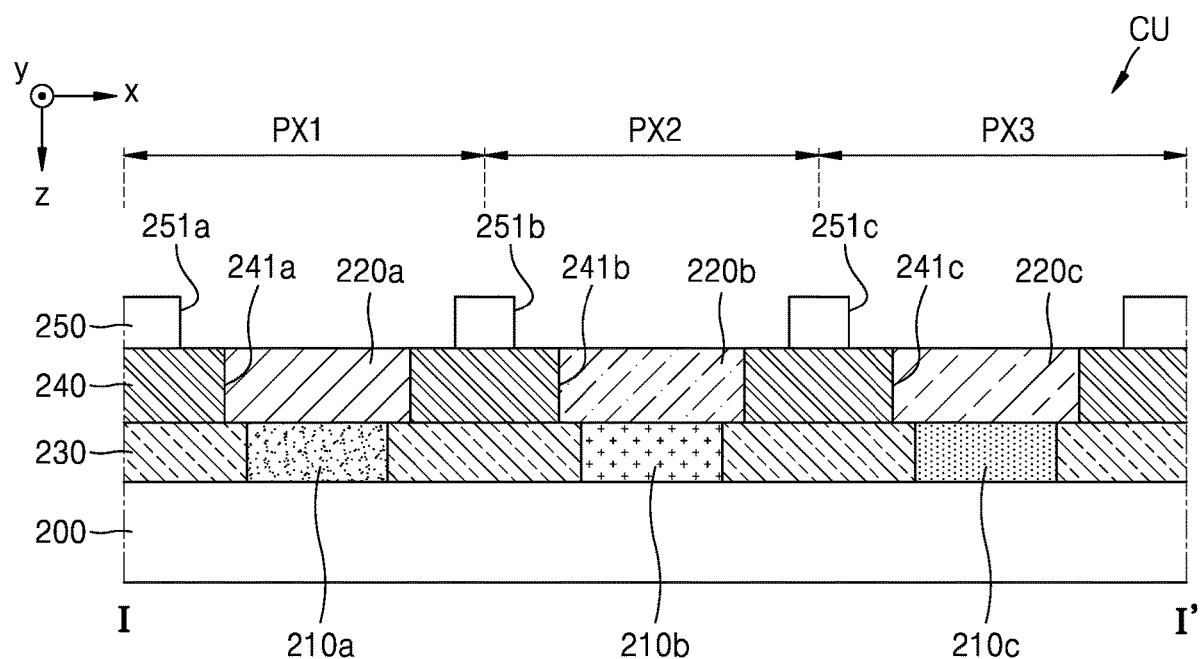
FIG. 6 is a schematic cross-sectional view of a color filter unit according to an embodiment.
Figure 7A:
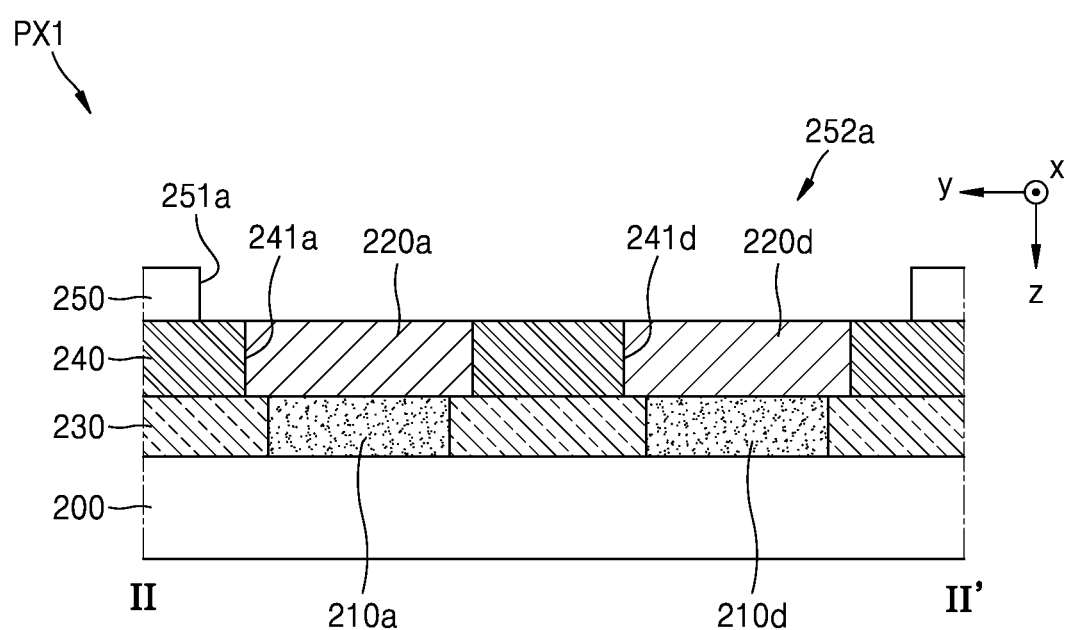
FIGS. 7A and 7B are each schematic cross-sectional views of a first pixel in a color filter unit according to an embodiment.
Figure 7B:
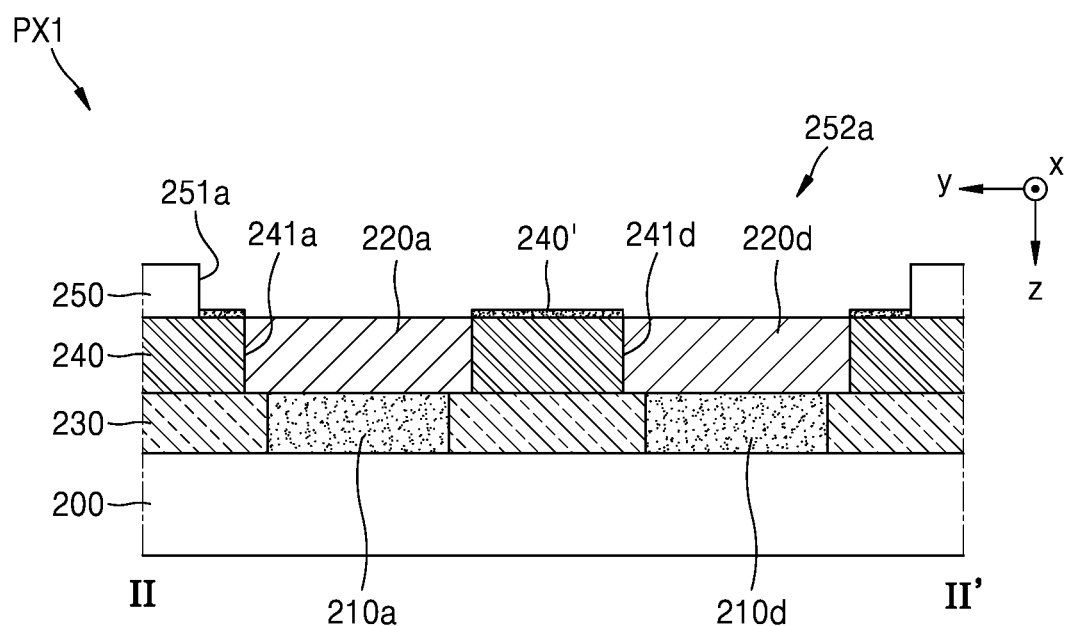
Figure 8:
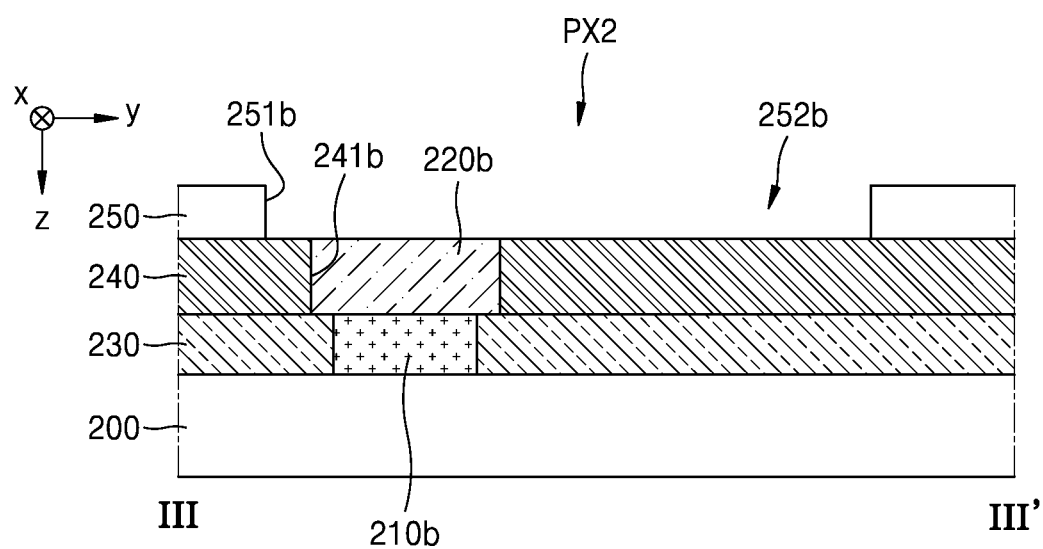
FIG. 8 is a schematic cross-sectional view of a second pixel in a color filter unit according to an embodiment.

FIG. 5 is a schematic plan view of a color filter unit CU according to an embodiment. FIGS. 6 to 8 are schematic cross-sectional views of a second pixel in a color filter unit CU according to an embodiment. FIG. 6 schematically shows a cross-section of the color filter unit CU taken along line I-I' of FIG. 5, FIGS. 7A and 7B each schematically show a cross-section of the color filter unit CU taken along line II-II' of FIG. 5 according to an embodiment, and FIG. 8 schematically shows a cross-section of the color filter unit CU taken along line III-III' of FIG. 5. With respect to FIGS. 5 to 8, the same reference numerals as in FIGS. 3 and 4 refer to the same members, and thus, repeated descriptions may not be provided.

Referring to FIG. 5, the display apparatus 1 (see FIG. 1) may include first to third pixels PX1 to PX3 to emit light of different colors. The first to third pixels PX1 to PX3 may include a first light-emitting device OLED1, a second light-emitting device OLED2, and a third light-emitting device OLED3 (see FIG. 11) such as OLEDs, respectively. Each of the first to third pixels PX1 to PX3 may emit, for example, red, blue, green, or white light through the OLED. The first to third pixels PX1 to PX3 may include a first emission area EA1, a second emission area EA2, and a third emission area EA3, which are areas from which light generated through the first to third light-emitting devices OLED1 to OLED3 are emitted to the outside, respectively. A non-emission area NEA is arranged between the first emission area EA1 and the second emission area EA2 and between the second emission area EA2 and the third emission area EA3, respectively. In some embodiments, the non-emission area NEA surrounds each of the first to third emission areas EA1 to EA3. Thus, the first to third emission areas EA1 to EA3 may be distinguished by the non-emission areas NEA. For example, the non-emission areas NEA may separate the first to third emission areas EA1 to EA3 in a plan view. The non-emission area NEA is shown in more detail in FIG. 11.

Because the display apparatus 1 includes the upper substrate 200 (see FIG. 6), the upper substrate 200 may include the first emission area EA1 corresponding to the first light-emitting device OLED1, the second emission area EA2 corresponding to the second light-emitting device OLED2, the third emission area EA3 corresponding to the third light-emitting device OLED3, and the non-emission area NEA, which is an area of the upper substrate 200 other than the first to third emission areas EA1 to EA3.

As described above in FIG. 2, the display apparatus 1 may include the color filter unit CU arranged on the display unit DU. The color filter unit CU may include the upper substrate 200, a light shielding layer 230, a first insulating layer 240, a second insulating layer 250, and the first to third filter layers 210a to 210c, the first color conversion layer 220a, the transmission layer 220b, and the second color conversion layer 220c.

Figure 11:
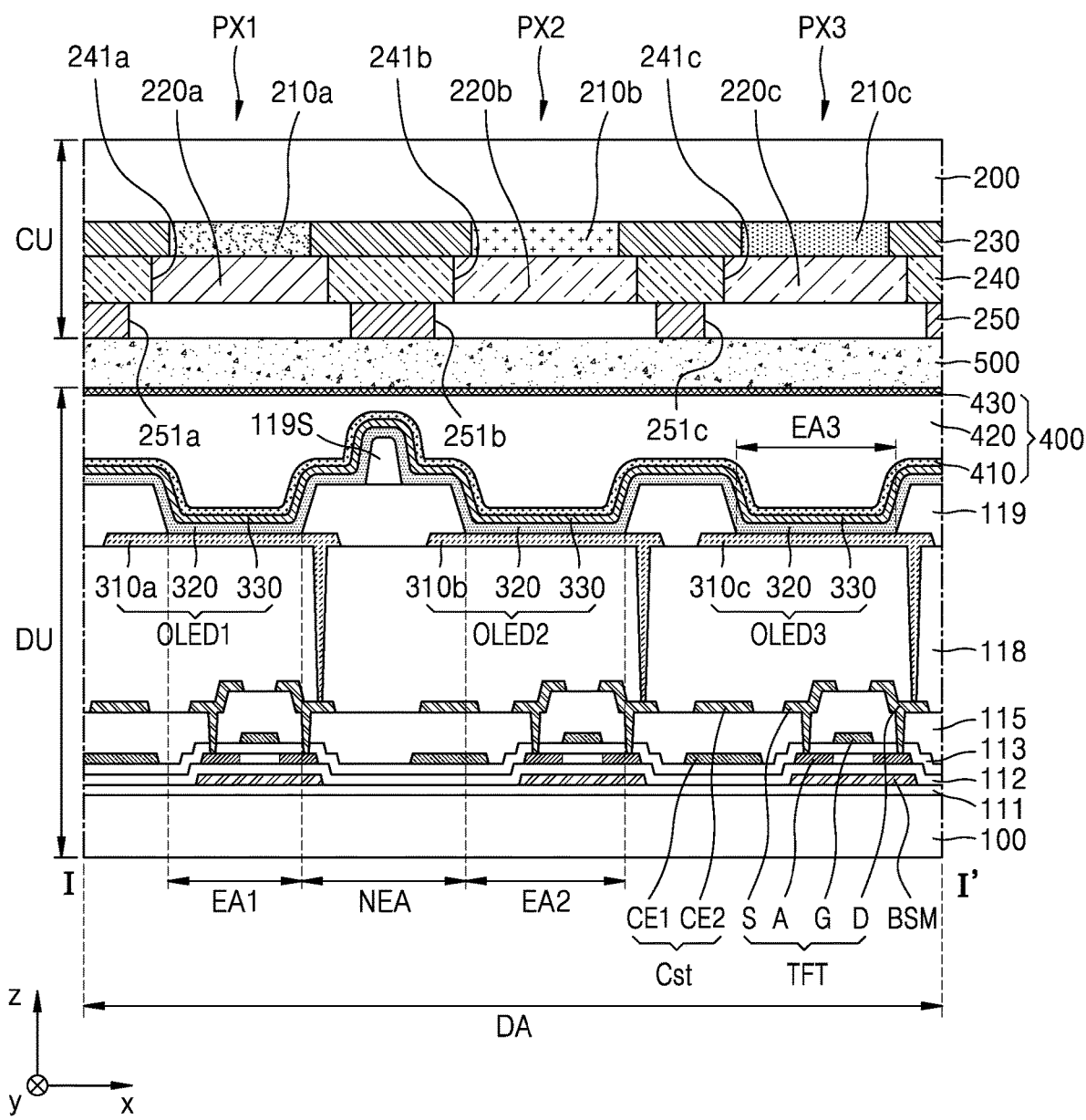
FIG. 11 is a schematic cross-sectional view of a display apparatus according to an embodiment.

In FIG. 6, for convenience of description, it is shown that various layers are stacked in a −z direction (negative z-axis direction) on the upper substrate 200, but the color filter unit CU according to the present embodiment may be substantially coupled (e.g., attached) to the display unit DU with the top and bottom reversed, as shown in FIG. 11. Therefore, hereinafter, descriptions will be provided in a stacking order on an upper substrate 200.

The display apparatus according to the present embodiment is premised (e.g., configured) to emit blue light or light in which blue light and green light are mixed, through an OLED, and thus, the transmission layer 220b may be arranged to correspond to the second filter layer 210b.

The upper substrate 200 may include (e.g., be) a glass material, a ceramic material, a metallic material, and/or a flexible and/or bendable material. When the upper substrate 200 is flexible and/or bendable, the upper substrate 200 may include (e.g., be) a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The upper substrate 200 may have a single-layered or multi-layered structure of the above materials. In the case where the upper substrate 200 has a multi-layered structure, the upper substrate 200 may further include an inorganic layer. In some embodiments, the upper substrate 200 may have a structure of an organic material/an inorganic material/an organic material. For example, the upper substrate 200 may have a stacked structure of an organic material layer, an inorganic material layer, and an organic material layer.

The light shielding layer 230 and the first to third filter layers 210a to 210c may be arranged on one surface of the upper substrate 200.

The light shielding layer 230 may be arranged between the first filter layer 210a and the second filter layer 210b and between the second filter layer 210b and the third filter layer 210c to correspond to the non-emission area NEA. In some embodiments, the light shielding layer 230 may surround each of the first to third filter layers 210a to 210c in a plan view to separate the first to third filter layers 210a to 210c in the plan view. For example, the light shielding layer 230 may be a layer having openings in which the first to third filter layers 210a to 210c are arranged. The light shielding layer 230, which is a black matrix, may be a layer for improving color clarity and contrast. The light shielding layer 230 may include (e.g., be) at least one of black pigment, black dye, or black particles. In some embodiments, the light shielding layer 230 may include chromium (Cr), $CrO_x$, $Cr/CrO_x$, $Cr/CrO_x/CrN_y$, a resin (e.g., carbon pigment, RGB mixed pigment), graphite, and/or non-Cr-based materials.

The first filter layer 210a may transmit only (e.g., substantially only) light having a wavelength of about 630 nm to about 780 nm, the second filter layer 210b may transmit only (e.g., substantially only) light having a wavelength of about 450 nm to about 495 nm, and the third filter layer 210c may transmit only (e.g., substantially only) light having a wavelength of about 495 nm to about 570 nm. For example, the first to third filter layers 210a to 210c may include (e.g., be) a red color filter, a blue color filter, and a green color filter, respectively. The light transmitted through the first to third filter layers 210a to 210c may have improved reproducibility of red, green, and blue colors, respectively.

The first insulating layer 240 may have a first opening 241a, a second opening 241b, and a third opening 241c that expose the first to third filter layers 210a to 210c, respectively. The first insulating layer 240 may include (e.g., be), for example, an organic material. In some cases, the first insulating layer 240 may include (e.g., be) a light shielding material to function as a light shielding layer. The light shielding material may include (e.g., be), for example, at least one of black pigment, black dye, black particles, or metal particles. For example, the first insulating layer 240 may be black. As another example, the first insulating layer 240 may be blue.

The first color conversion layer 220a, the transmission layer 220b, and the second color conversion layer 220c may be arranged in the first to third openings 241a to 241c, respectively. The first color conversion layer 220a, the transmission layer 220b, and the second color conversion layer 220c may have a structure as shown in FIG. 3.

The second insulating layer 250 may include a first open portion 251a, a second open portion 251b, and a third open portion 251c that expose the first color conversion layer 220a, the transmission layer 220b, and the second color conversion layer 220c, respectively. The second insulating layer 250 may include (e.g., be), for example, an organic material. In some cases, the second insulating layer 250 may include (e.g., be) at least one of black pigment, black dye, black particles, or metal particles to function as a light shielding layer. For example, the second insulating layer 250 may be black. As another example, the second insulating layer 250 may be blue.

Referring back to FIG. 5, the first to third pixels PX1 to PX3 may include the first color conversion layer 220a, the transmission layer 220b, and the second color conversion layer 220c, respectively. In addition, the first to third pixels PX1 to PX3 may include the first to third filter layers 210a to 210c (see the dotted lines in FIG. 5), respectively.

As described in FIG. 6, the first insulating layer 240 arranged on the upper substrate 200 may include the first to third openings 241a to 241c. The first opening 241a may correspond to (e.g., may overlap) the first emission area EA1, the second opening 241b may correspond to (e.g., may overlap) the second emission area EA2, and the third opening 241c may correspond to (e.g., may overlap) the third emission area EA3. In an embodiment, as shown in FIG. 5, a size of the first opening 241a and a size of the third opening 241c may be smaller than a size of the second opening 241b. For example, the second opening 241b may have the largest size among the first to third openings 241a to 241c.

In an embodiment, as shown in FIG. 5, the first insulating layer 240 may further include a first auxiliary opening 241d and a second auxiliary opening 241e. In this case, the first auxiliary opening 241d may correspond to the non-emission area NEA and may be located in a first direction (e.g., a −y direction (negative y-axis direction)) from the first opening 241a. For example, the first auxiliary opening 241d may be spaced apart from the first opening 241a in the first direction and may overlap a first portion of the non-emission area NEA. In addition, the second auxiliary opening 241e may correspond to the non-emission area NEA and may be located in the first direction from the third opening 241c. For example, the second auxiliary opening 241e may be spaced apart from the third opening 241c in the first direction and may overlap a second portion of the non-emission area NEA. In some embodiments, the first insulating layer 240 may surround the first and second auxiliary openings 241d and 241e to separate them from the first and third openings 241c and 241d, respectively, in a plan view. In some embodiments, the second opening 241b corresponding to (e.g., overlapping) the second emission area EA2 may be arranged between the first auxiliary opening 241d and the second auxiliary opening 241e. For example, the second opening 241b may be between the first auxiliary opening 241d and the second auxiliary opening 241e along an x-axis direction perpendicular (e.g., substantially perpendicular) to the first direction.

Referring to FIG. 7A schematically showing a cross-sectional view of the first pixel PX1, the first color conversion layer 220a may be arranged in the first opening 241a formed in the first insulating layer 240, and a first auxiliary color conversion layer 220d may be arranged in the first auxiliary opening 241d formed in the first insulating layer 240. The first auxiliary color conversion layer 220d may have the same structure as the first color conversion layer 220a. For example, the first color conversion layer 220a and the first auxiliary color conversion layer 220d may include first quantum dots 221a (see FIG. 4) that are to convert incident light into light of a first color. As an example, the first color may be red.

Though the descriptions are made based on the first pixel PX1, the third pixel PX3 may be applied in the same manner. The second color conversion layer 220c may be arranged in the third opening 241c formed in the first insulating layer 240, and a second auxiliary color conversion layer 220e may be arranged in the second auxiliary opening 241e formed in the first insulating layer 240. The second auxiliary color conversion layer 220e may have the same structure as the second color conversion layer 220c. For example, the second color conversion layer 220c and the second auxiliary color conversion layer 220e may include second quantum dots 221c (see FIG. 4) that are to convert incident light into light of a second color. As an example, the second color may be green.

The first filter layer 210a may be between the upper substrate 200 and the first color conversion layer 220a, and a first auxiliary filter layer 210d may be between the upper substrate 200 and the first auxiliary color conversion layer 220d. In this case, the first filter layer 210a and the first auxiliary filter layer 210d may include red color filters that transmit only light having a wavelength of about 630 nm to about 780 nm.

Though the descriptions are made based on the first pixel PX1, the third pixel PX3 may be applied in the same manner. The third filter layer 210c may be between the upper substrate 200 and the second color conversion layer 220c, and a second auxiliary filter layer 210e may be between the upper substrate 200 and the second auxiliary color conversion layer 220e. In this case, the third filter layer 210c and the second auxiliary filter layer 210e may include green color filters that transmit only light having a wavelength of about 495 nm to about 570 nm.

In addition, as described in FIG. 6, the second insulating layer 250 arranged on the first insulating layer 240 may include the first to third open portions 251a to 251c. In this case, the first open portion 251a may correspond to the first opening 241a and the first auxiliary opening 241d, the second open portion 251b may correspond to the second opening 241b, and the third open portion 251c may correspond to the third opening 241c and the second auxiliary opening 241e.

The first open portion 251a and the third open portion 251c may include a first extension portion 252a and a third extension portion 252c, which extend in the first direction and expose at least a portion of the first insulating layer 240, respectively. In some embodiments, the first extension portion 252a may extend in the first direction to expose the first auxiliary color conversion layer 220d and the third extension portion 252c may extend in the first direction to expose the second auxiliary color conversion layer 220e. The second open portion 251b may include a second extension portion 252b extending in a second direction (e.g., a +y direction (positive y-axis direction)), which is opposite to the first direction, and exposing at least a portion of the first insulating layer 240 (see FIG. 8). In an embodiment, a width of the first to third extension portions 252a to 252c may be the same (e.g., substantially the same). For example, a width of the first to third extension portions 252a to 252c along the x-axis direction (see FIG. 5) may be the same (e.g., substantially the same).

As a comparative example, an insulating layer arranged on an upper substrate may include only an opening corresponding to an emission area. For example, a color conversion layer and a filter layer are arranged on the upper substrate to correspond to the emission area, but the color conversion layer and the filter layer may not be arranged to correspond to a non-emission area. For example, the insulating layer may include openings corresponding to the emission area, but the openings may not include portions that correspond to the non-emission area. In this case, color of reflected light formed by reflection of external light on the display apparatus when the display apparatus is not driven may be tinged with blue rather than black.

For example, light-emitting devices included in the display apparatus may emit light in which blue light and green light are mixed. When the light in which blue light and green light are mixed passes through a red color conversion layer and a red color filter, luminance of the light increases more than (e.g., is greater than) when only the blue light passes through the red color conversion layer and the red color filter. Similarly, when the light in which blue light and green light are mixed passes through a green color conversion layer and a green color filter, luminance of the light increases more than (e.g., is greater than) when only the blue light passes through the green color conversion layer and the green color filter. However, when the light in which blue light and green light are mixed passes through a transmission layer and a blue color filter, there is no difference in luminance from when only blue light passes through the transmission layer and the blue color filter. For example, efficiencies of a red sub-pixel, a green sub-pixel, and a blue sub-pixel are different from one another. Therefore, an opening of the blue sub-pixel is enlarged to adjust the efficiency of the blue sub-pixel to be similar to the efficiencies of the red sub-pixel and the green sub-pixel. Through this process, the opening (e.g., the planar area of the opening) of the blue sub-pixel is enlarged, and the color of reflected light formed by external light on the display apparatus when the display apparatus is not driven is greatly affected by the blue sub-pixel having the largest opening and may thus be tinged with blue rather than black.

However, the first insulating layer 240 included in the display apparatus 1 according to an embodiment of the present disclosure may further include the first auxiliary opening 241d and the second auxiliary opening 241e. The first auxiliary color conversion layer 220d may be arranged in the first auxiliary opening 241d, and the second auxiliary color conversion layer 220e may be arranged in the second auxiliary opening 241e. In addition, the first auxiliary filter layer 210d may be between the upper substrate 200 and the first auxiliary color conversion layer 220d, and the second auxiliary filter layer 210e may be between the upper substrate 200 and the second auxiliary color conversion layer 220e. The first to third light-emitting devices OLED1 to OLED3 included in the display apparatus 1 according to an embodiment may emit light in which blue light and green light are mixed (see FIG. 3), and in this case, the second opening 241b among the first to third openings 241a to 241c may have the largest size. Though the second opening 241b has the largest size, the first auxiliary color conversion layer 220d, the first auxiliary filter layer 210d, the second auxiliary color conversion layer 220e, and the second auxiliary filter layer 210e are arranged on the upper substrate 200, and thus, the reflected color formed by external light on the display apparatus 1 when the display apparatus 1 is not driven may be tinged with black without biasing toward blue. For example, the influence of the transmission layer 220b and the second filter layer 210b corresponding to the second opening 241b having the largest size is offset by the first auxiliary color conversion layer 220d, the first auxiliary filter layer 210d, the second auxiliary color conversion layer 220e, and the second auxiliary filter layer 210e, and thus, the reflected color may be tinged with black. For example, the planar area of the first auxiliary color conversion layer 220d, the first auxiliary filter layer 210d, the second auxiliary color conversion layer 220e, and the second auxiliary filter layer 210e may be set so that the color of external light reflected from the display apparatus 1 is not biased or disproportioned towards red, green, or blue (e.g., so that the color of external light reflected from the display apparatus 1 is black).

In an embodiment, as shown in FIG. 7B, a surface 240' of the first insulating layer 240 exposed by the first open portion 251a may have different properties from the first quantum dots 221a included in the first color conversion layer 220a. As an example, the surface 240' of the first insulating layer 240 may have hydrophobicity. The surface 240' having hydrophobicity may be formed by gas plasma treatment utilizing gas containing a halogen group element such as carbon tetrafluoride ($CF_4$), sulfur hexafluoride ($SF_6$), nitrogen trifluoride ($NF_3$), etc. or a fluorine coating. Because the surface 240' of the first insulating layer 240 exposed by the first open portion 251a has hydrophobicity, the first color conversion layer 220a may be easily formed only in the first opening 241a.

Referring back to FIG. 5, on a plane, the first to third openings 241a to 241c may have a square shape. When the first to third openings 241a to 241c have a square shape, an amount of light that is not emitted from both edge areas of the first to third openings 241a to 241c may be reduced compared to when openings have a rectangular shape. In addition, even when the first to third openings 241a to 241c have a square shape, the first to third openings 241a to 241c may be formed with the same area (e.g., planar area) as when openings have a rectangular shape.

When the first to third openings 241a to 241c have a square shape, extension lines coupling (e.g., connecting) a center of one of the first to third openings 241a to 241c to centers of the other two of the first to third openings 241a to 241c, respectively, may cross each other. As shown in FIG. 5, a first extension line l and a second extension line l' may cross each other.

Figure 9:
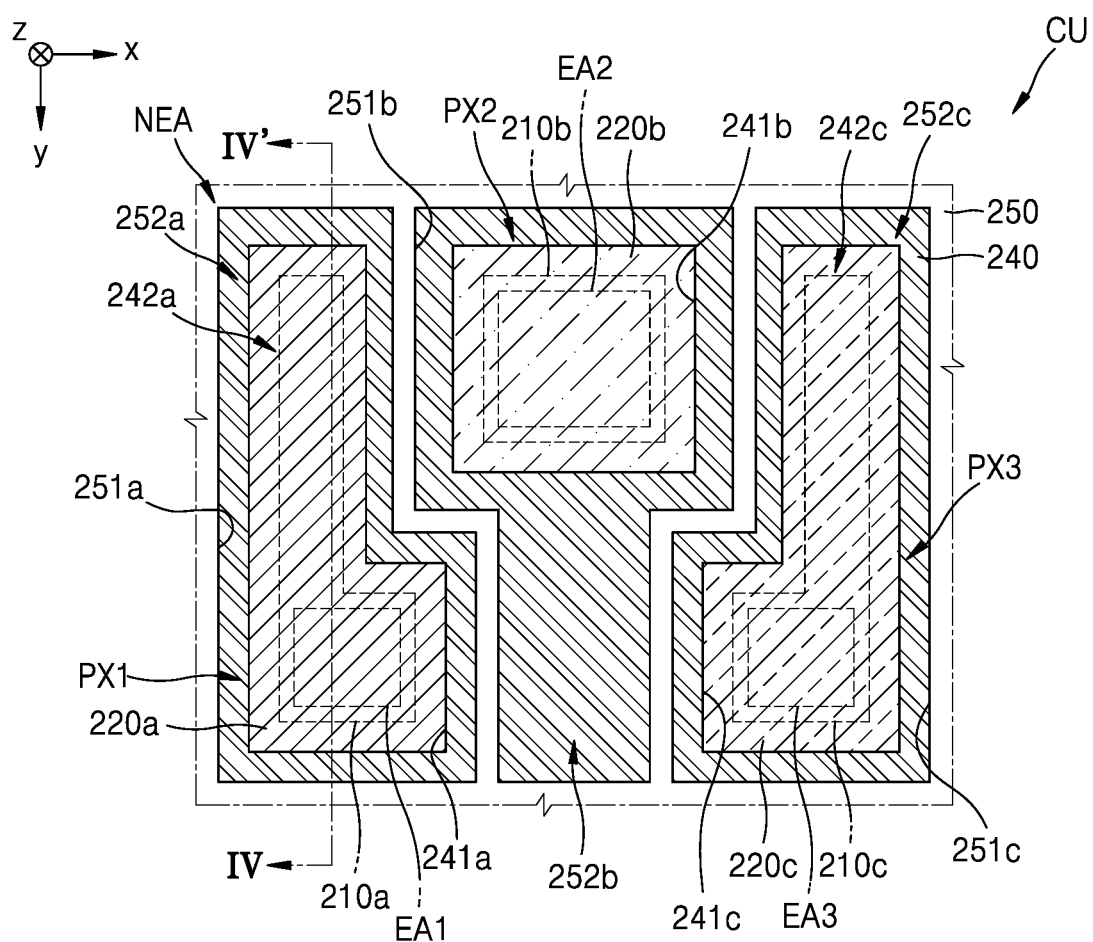
FIG. 9 is a schematic plan view of a color filter unit according to an embodiment.
Figure 10:
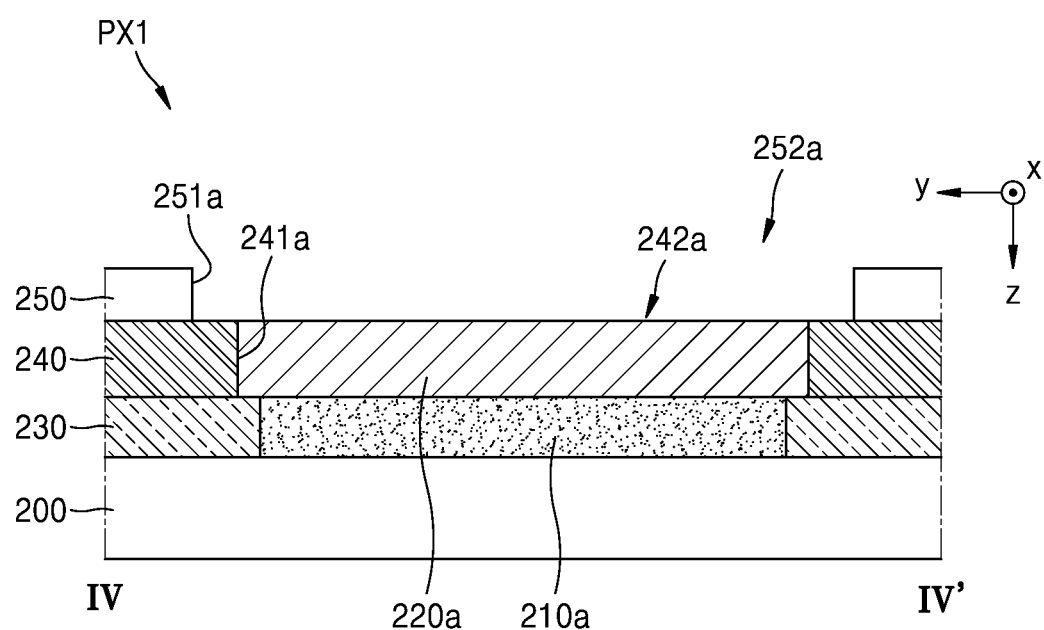
FIG. 10 is a schematic cross-sectional view of a first pixel in a color filter unit according to an embodiment.

FIG. 9 is a schematic plan view of a color filter unit CU according to an embodiment. FIG. 10 is a schematic cross-sectional view of a first pixel PX1 in a color filter unit according to an embodiment. FIG. 10 schematically shows a cross-section of the color filter unit CU taken along line IV-IV' of FIG. 9. With respect to FIGS. 9 and 10, the same reference numerals as in FIGS. 3 to 6 refer to the same members, and thus, repeated descriptions may not be provided.

Referring to FIG. 9, the display apparatus 1 (see FIG. 1) may include the first to third pixels PX1 to PX3 that are to emit light of different colors. The first to third pixels PX1 to PX3 may include the first to third light-emitting devices OLED1 to OLED3 (see FIG. 11) such as OLEDs, respectively. Each of the first to third pixels PX1 to PX3 may emit, for example, red, blue, green, or white light through the OLED. The first to third pixels PX1 to PX3 may include the first to third emission areas EA1 to EA3, respectively, which are areas from which light generated through the first to third light-emitting devices OLED1 to OLED3 are emitted to the outside. The non-emission area NEA is arranged between the first emission area EA1 and the second emission area EA2 and between the second emission area EA2 and the third emission area EA3, respectively, and thus, the first to third emission areas EA1 to EA3 may be distinguished (e.g., separated or spaced apart in a plan view) by the non-emission areas NEA. The non-emission area NEA is shown in more detail in FIG. 11.

In an embodiment, as shown in FIGS. 9 and 10, the first insulating layer 240 arranged on the upper substrate 200 may include the first opening 241a corresponding to the first emission area EA1. In this case, the first opening 241a may include a first auxiliary extension portion 242a extending toward the non-emission area NEA along the first direction (e.g., the -y direction (negative y-axis direction)). The first color conversion layer 220a may be arranged in the first opening 241a. The first filter layer 210a may be between the upper substrate 200 and the first color conversion layer 220a.

In addition, the second insulating layer 250 arranged on the first insulating layer 240 may include the first open portion 251a corresponding to the first opening 241a. The first open portion 251a may include the first extension portion 252a extending toward the non-emission area NEA along the first direction. In FIG. 10, the surface of the first insulating layer 240 exposed by the first open portion 251a may have hydrophobicity as described with respect to FIG. 7B.

Though the descriptions are made based on the first pixel PX1, the third pixel PX3 may be applied in the same manner. The first insulating layer 240 arranged on the upper substrate 200 may include the third opening 241c corresponding to the third emission area EA3. In this case, the third opening 241c may include a second auxiliary extension portion 242c extending toward the non-emission area NEA along the first direction. The second color conversion layer 220c may be arranged in the third opening 241c. The third filter layer 210c may be between the upper substrate 200 and the second color conversion layer 220c. In addition, the second insulating layer 250 arranged on the first insulating layer 240 may include the third open portion 251c corresponding to the third opening 241c. The third open portion 251c may include the third extension portion 252c extending toward the non-emission area NEA along the first direction.

The second pixel PX2 may be different from the first pixel PX1 and the third pixel PX3. For example, the first insulating layer 240 arranged on the upper substrate 200 may include the second opening 241b corresponding to the second emission area EA2, but the second opening 241b may not include an auxiliary extension portion as in the first opening 241a and the third opening 241c. The transmission layer 220b may be arranged in the second opening 241b, and the second filter layer 210b may be between the upper substrate 200 and the transmission layer 220b. In addition, the second insulating layer 250 arranged on the first insulating layer 240 may include the second open portion 251b corresponding to the second opening 241b. The second open portion 251b may include the second extension portion 252b extending toward the non-emission area NEA along the second direction (e.g., the +y direction (positive y-axis direction)) which is opposite to the first direction. For example, the second open portion 251b may include the second extension portion 252b extending in the second direction and exposing at least a portion of the first insulating layer 240.

Referring back to FIG. 9, the second opening 241b may be arranged between the first auxiliary extension portion 242a of the first opening 241a and the second auxiliary extension portion 242c of the third opening 241c.

In addition, on a plane, the first opening 241a may have an "L" shape, and the second opening 241b may have a square shape. In addition, the third opening 241c may have a shape in which the shape of the first opening 241a is inverted based on the y-axis. For example, the shape of the third opening 241c may be reflectively symmetrical to the first opening 241a with respect to an imaginary line extending along the y-axis direction through the second opening 241b (e.g., through a center of the second opening 241b). When the second opening 241b has a square shape, an amount of light that is not emitted from both edge areas of the second opening 241b may be reduced compared to when an opening has a rectangular shape.

The first insulating layer 240 included in the display apparatus 1 according to an embodiment may include the first opening 241a and the third opening 241c, and the first opening 241a and the third opening 241c may include the first auxiliary extension portion 242a and the second auxiliary extension portion 242c, respectively. The first color conversion layer 220a may be arranged in the first auxiliary extension portion 242a, and the second color conversion layer 220c may be arranged in the second auxiliary extension portion 242c. In addition, the first filter layer 210a may be between the upper substrate 200 and the first color conversion layer 220a, and the third filter layer 210c may be between the upper substrate 200 and the second color conversion layer 220c. The first to third light-emitting devices OLED1 to OLED3 included in the display apparatus 1 according to an embodiment may emit light in which blue light and green light are mixed (see FIG. 3), and in this case, the second emission area EA2 among the first to third emission areas EA1 to EA3 may have the largest size. Though the second emission area EA2 has the largest size, the first insulating layer 240 includes the first auxiliary extension portion 242a in which the first color conversion layer 220a is arranged and the second auxiliary extension portion 242c in which the second color conversion layer 220c is arranged, and thus, the color of reflected light formed by reflected external light that travels after being reflected by the display apparatus 1 when the display apparatus 1 is not driven may be tinged with black. For example, the influence of the transmission layer 220b and the second filter layer 210b arranged to correspond to the second pixel PX2 having the largest emission area is offset by the first auxiliary extension portion 242a arranged by extending from the first color conversion layer 220a and the first filter layer 210a and the second auxiliary extension portion 242c arranged by extending from the second color conversion layer 220c and the third filter layer 210c, and thus, the reflected color on the display apparatus 1 may be tinged with black without biasing toward blue. For example, the planar area of portions of the first color conversion layer 220a, the first filter layer 210a, the second color conversion layer 220c, and the third filter layer 210c corresponding to the non-emission area NEA may be set so that the color of external light reflected from the display apparatus 1 is not biased or disproportioned towards red, green, or blue (e.g., so that the color of external light reflected from the display apparatus 1 is black).

FIG. 11 is a schematic cross-sectional view of a display apparatus 1 according to an embodiment. With respect to FIG. 11, the same reference numerals as in FIGS. 3 to 6 refer to the same members, and thus, repeated descriptions may not be provided.

The display area DA of the display apparatus 1 according to the present embodiment may include the first to third pixels PX1 to PX3. This is merely an example, and the display apparatus 1 may include more pixels.

The first to third pixels PX1 to PX3 may include the first to third emission areas EA1 to EA3, respectively. The first to third emission areas EA1 to EA3 may be areas from which light is generated and emitted to the outside. The non-emission area NEA is arranged between the first emission EA1 and the second emission area EA2 and between the second emission area EA2 and the third emission area EA3, and thus, the first to third emission areas EA1 to EA3 may be distinguished (e.g., separated or spaced apart in a plan view) by the non-emission areas NEA.

The first to third pixels PX1 to PX3 may implement (e.g., emit) light of different colors. For example, the first pixel PX1 may implement red light, the second pixel PX2 may implement blue light, and the third pixel PX3 may implement green light. In a plan view, the first to third emission areas EA1 to EA3 may have various suitable shapes, such as various suitable polygonal shapes or a circular shape and may also have various suitable arrangements such as a stripe arrangement, a pentile arrangement, etc.

The display apparatus 1 according to the present embodiment may include the first color conversion layer 220a, the transmission layer 220b, and the second color conversion layer 220c to correspond to the first to third emission areas EA1 to EA3, respectively. The first color conversion layer 220a, the transmission layer 220b, and the second color conversion layer 220c may include quantum dots and/or metal nanoparticles.

For example, the first pixel PX1 may include the first color conversion layer 220a, the second pixel PX2 may include the transmission layer 220b, and the third pixel PX3 may include the second color conversion layer 220c. In the present embodiment, quantum dots included in the first and second color conversion layers 220a and 220c may have different average sizes.

Hereinafter, the display apparatus according to the embodiment will be described in more detail according to a stacking order shown in FIG. 11.

The lower substrate 100 may include (e.g., be) a glass material, a ceramic material, a metallic material, and/or a flexible and/or bendable material. When the lower substrate 100 is flexible and/or bendable, the lower substrate 100 may include (e.g., be) a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The lower substrate 100 may have a single-layered or multi-layered structure of the above materials, and in the case where the lower substrate 100 has a multi-layered structure, the lower substrate 100 may further include an inorganic layer. In an embodiment, the lower substrate 100 may have a structure of an organic material/an inorganic material/an organic material.

A barrier layer may be further included between the lower substrate 100 and a first buffer layer 111. The barrier layer may prevent, minimize, or block penetration of impurities from the lower substrate 100 or the like into a semiconductor layer A. The barrier layer may include (e.g., be) an inorganic material such as an oxide and/or a nitride, an organic material, and/or an organic-inorganic composite and may have a single-layered or a multi-layered structure of an inorganic material and an organic material.

A bias electrode BSM may be arranged on the first buffer layer 111 to correspond to a thin-film transistor TFT. A voltage may be applied to the bias electrode BSM. In addition, the bias electrode BSM may prevent or block external light from reaching the semiconductor layer A. Accordingly, characteristics of the thin-film transistor TFT may be stabilized. The bias electrode BSM may be omitted in some cases.

The semiconductor layer A may be arranged on a second buffer layer 112. The semiconductor layer A may include (e.g., be) amorphous silicon and/or polysilicon. In another embodiment, the semiconductor layer A may include (e.g., be) an oxide of at least one material selected from the group consisting of indium (In), gallium (Ga), tin (stannum) (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer A, which is a Zn oxide-based material, may include (e.g., be) Zn oxide, In—Zn oxide, Ga—In—Zn oxide, etc. In another embodiment, the semiconductor layer A may include (e.g., be) an In-Ga—Zn-O (IGZO), In—Sn—Zn—O (ITZO), and/or In—Ga—Sn—Zn—O (IGTZO) semiconductor in which metal such as In, Ga, and Sn are contained in ZnO. The semiconductor layer A may include a channel area, and a source area and a drain area arranged on both sides of the channel area. The semiconductor layer A may include a single layer or a multi-layer.

A gate electrode G may be arranged on the semiconductor layer A with a gate insulating layer 113 therebetween to at least partially overlap the semiconductor layer A. The gate electrode G may include (e.g., be) molybdenum (Mo), Al, copper (Cu), Ti, etc. and may include a single layer or a multi-layer structure. As an example, the gate electrode G may include (e.g., be) a single layer of Mo. A first electrode CE1 of a storage capacitor Cst may be arranged on the same layer as the gate electrode G. The first electrode CE1 may include (e.g., be) the same material as the gate electrode G.

Though it is shown in FIG. 11 that the gate electrode G of the thin-film transistor TFT and the first electrode CE1 of the storage capacitor Cst are separately arranged, the storage capacitor Cst may overlap the thin-film transistor TFT, and the gate electrode G of the thin-film transistor TFT may function as the first electrode CE1 of the storage capacitor Cst.

An interlayer insulating layer 115 may be provided to cover the gate electrode G and the first electrode CE1 of the storage capacitor Cst. The interlayer insulating layer 115 may include (e.g., be) silicon oxide ($SiO_2$), silicon nitride ($SiN_x$), silicon oxynitride (SiON), aluminum oxide ($Al_2O_3$), tantalum oxide ($TiO_2$), tantalum oxide ($Ta_2O_5$), hafnium oxide ($HfO_2$), and/or zinc oxide ($ZnO_2$).

A second electrode CE2 of the storage capacitor Cst, and a source electrode S and a drain electrode D of the thin-film transistor TFT, may be arranged on the interlayer insulating layer 115.

The second electrode CE2 of the storage capacitor Cst, and the source electrode S and the drain electrode D of the thin-film transistor TFT, may include (e.g., be) a conductive material including (e.g., being) Mo, Al, Cu, Ti, etc. and may include a single layer or a multi-layer structure including (e.g., being) the above materials. As an example, the second electrode CE2, the source electrode S, and the drain electrode D may have a multi-layered structure of Ti/Al/Ti. The source electrode S and the drain electrode D may be coupled (e.g., connected) to the source area or the drain area of the semiconductor layer A through a contact hole. For example, the source electrode S and the drain electrode D may be respectively coupled to the source area and the drain area of the semiconductor layer through respective contact holes.

The second electrode CE2 of the storage capacitor Cst may overlap the first electrode CE1 with the interlayer insulating layer 115 therebetween and may be to form a capacitance. In this case, the interlayer insulating layer 115 may function as a dielectric layer of the storage capacitor Cst.

A planarization layer 118 may be arranged on the second electrode CE2, the source electrode S, and the drain electrode D, and the first to third light-emitting devices OLED1 to OLED3 may be arranged on the planarization layer 118.

The planarization layer 118 may include a single layer or a multi-layer structure including an organic material layer and may provide a flat upper surface. The planarization layer 118 may include (e.g., be) a general-purpose polymer such as benzocyclobutene (BCB), polyimide, hexamethyldisiloxane (HMDSO), polymethylmethacrylate (PMMA) and/or polystyrene (PS), and/or polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In the display area DA of the lower substrate 100, the first to third light-emitting devices OLED1 to OLED3 may be arranged on the planarization layer 118. The first to third light-emitting devices OLED1 to OLED3 may include a first pixel electrode 310a, a second pixel electrode 310b, and a third pixel electrode 310c, respectively, and may commonly include an intermediate layer 320 and an opposite electrode 330. The intermediate layer 320 may include an organic emission layer. In addition, as described in FIG. 3, the first blue emission unit 320a, the second blue emission unit 320b, the third blue emission unit 320c, and the green emission unit 320d may be sequentially stacked on the first to third pixel electrodes 310a to 310c. Therefore, the first to third light-emitting devices OLED1 to OLED3 may emit light in which blue light and green light are mixed.

The first to third pixel electrodes 310a to 310c may include (semi)transmissive electrodes or reflective electrodes. In some embodiments, the first to third pixel electrodes 310a to 310c may include (e.g., be) transmissive electrodes, semi-transmissive electrodes, or reflective electrodes. In some embodiments, the first to third pixel electrodes 310a to 310c may each include a reflective layer, and a transparent or semi-transparent electrode layer formed on the reflective layer. The reflective layer may include (e.g., be) silver (Ag), magnesium (Mg), Al, platinum (Pt), palladium (Pd), gold (Au), nickel (Ni), neodymium (Nd), iridium (Ir), Cr, or a compound thereof. The transparent or semi-transparent electrode layer may include (e.g., be) at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first to third pixel electrodes 310a to 310c may each include (e.g., be) ITO/Ag/ITO (e.g., a ITO/Ag/ITO stack).

A pixel-defining layer 119 may be arranged on the planarization layer 118. In addition, the pixel-defining layer 119 may increase a distance between edges of the first to third pixel electrodes 310a to 310c and the opposite electrode 330 on the first to third pixel electrodes 310a to 310c, thereby preventing or suppressing arcs or the like from occurring at edges of the first to third pixel electrodes 310a to 310c. For example, the pixel-defining layer 119 may cover a side portion of each of the first to third pixel electrodes 310a to 310c and may have openings overlapping a center portion of each of the first to third pixel electrodes 310a to 310c. In some embodiments, the openings of the pixel-defining layer 119 may correspond to (e.g., define) the first to third emission areas EA1 to EA3, but the present disclosure is not limited thereto.

The pixel-defining layer 119 may include (e.g., be) at least one organic insulating material selected from the group consisting of polyimide, polyamide, acrylic resin, benzocyclobutene, and phenol resin and may be formed by spin coating and/or the like.

The intermediate layer 320 of the first to third light-emitting devices OLED1 to OLED3 may include an organic emission layer. The organic emission layer may include (e.g., be) an organic material including (e.g., being) a fluorescent and/or phosphorescent material that is to emit red, green, blue, or white light. The organic emission layer may include (e.g., be) a low-molecular weight organic material and/or a polymer organic material. A functional layer such as an HTL, a hole injection layer (HIL), an ETL, and/or an electron injection layer (EIL) may selectively be further arranged over and below the organic emission layer. For example, the HIL, HTL, organic emission layer, ETL, and EIL may be stacked in this order, but the present disclosure is not limited thereto.

Though it is shown in FIG. 11 that the intermediate layer 320 is formed as one body over the first to third pixel electrodes 310a to 310c, the present disclosure is not limited thereto. The intermediate layer 320 may be variously and suitably modified. For example, the intermediate layer 320 may be arranged to correspond to the first to third pixel electrodes 310a to 310c, respectively.

In the present embodiment, the first to third light-emitting devices OLED1 to OLED3 may all include an organic emission layer that is to emit light of the same color. For example, the first to third light-emitting devices OLED1 to OLED3 may all be to emit blue light. As another example, the first to third light-emitting devices OLED1 to OLED3 may all be to emit light in which blue light and green light are mixed.

The opposite electrode 330 may include a transmissive electrode or a reflective electrode. In some embodiments, the opposite electrode 330 may include a transparent or semi-transparent electrode and may include a metal thin-film that has a small work function and includes (e.g., is) lithium (Li), calcium (Ca), LiF/Ca, LiF/Al, Al, Ag, Mg, or a compound thereof. In addition, a transparent conductive oxide (TCO) layer such as ITO, IZO, ZnO, or $In_2O_3$ may be further arranged on the metal thin-film. The opposite electrode 330 may be arranged over the display area DA and the non-display area NDA and may be arranged over the intermediate layer 320 and the pixel-defining layer 119. The opposite electrode 330 may be formed as one body over the first to third light-emitting devices OLED1 to OLED3 to correspond to the first to third pixel electrodes 310a to 310c.

A spacer 119S may be further provided on the pixel-defining layer 119 for preventing or suppressing a mask dent. The spacer 119S may be formed as one body with the pixel-defining layer 119. For example, the spacer 119S and the pixel-defining layer 119 may be concurrently or simultaneously formed in the same process utilizing a half-tone mask process.

Because the first to third light-emitting devices OLED1 to OLED3 may be easily damaged by external moisture and/or oxygen, a thin-film encapsulation layer 400 may cover and protect the first to third light-emitting devices OLED1 to OLED3. The thin-film encapsulation layer 400 may cover the display area DA and extend to the outside of the display area DA. The thin-film encapsulation layer 400 may include at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include (e.g., be) silicon oxide, silicon nitride, and/or silicon oxynitride. Other layers such as a capping layer or the like may be arranged between the first inorganic encapsulation layer 410 and the opposite electrode 330. Because the first inorganic encapsulation layer 410 is formed along an underlying structure thereof, an upper surface of the first inorganic encapsulation layer 410 may not be flat. The organic encapsulation layer 420 may cover the first inorganic encapsulation layer 410. Unlike the first inorganic encapsulation layer 410, an upper surface of the organic encapsulation layer 420 may be substantially flat.

Even when cracks occur in the thin-film encapsulation layer 400, the aforementioned multi-layered structure of the thin-film encapsulation layer 400 may prevent, or reduce the occurrence of, these cracks from being coupled (e.g., connected) between the first inorganic encapsulation layer 410 and the organic encapsulation layer 420 or between the organic encapsulation layer 420 and the second inorganic encapsulation layer 430. Therefore, the formation of a passage through which external moisture and/or oxygen may penetrate into the display area DA may be prevented, minimized, or reduced.

The upper substrate 200 may be located above the lower substrate 100, and the opposite electrode 330 may be between the upper substrate 200 and the lower substrate 100. The upper substrate 200 may include (e.g., be) glass, metal, and/or a polymer resin.

The light shielding layer 230, the first insulating layer 240, and the second insulating layer 250 are sequentially arranged on a lower surface of the upper substrate 200 in a direction of (e.g., in a direction toward) the lower substrate 100. The light shielding layer 230 may include openings corresponding to the first to third emission areas EA1 to EA3, respectively. The first to third filter layers 210a to 210c may be arranged in the openings, respectively. In addition, the first insulating layer 240 may include the first to third openings 241a to 241c to correspond to the first to third emission areas EA1 to EA3, respectively. The first color conversion layer 220a may be arranged in the first opening 241a, the transmission layer 220b may be arranged in the second opening 241b, and the second color conversion layer 220c may be arranged in the third opening 241c. The second insulating layer 250 may include the first to third open portions 251a to 251c to correspond to the first to third openings 241a to 241c, respectively.

The first insulating layer 240 included in the display apparatus 1 according to an embodiment may further include the first auxiliary opening 241d and the second auxiliary opening 241e. The first auxiliary color conversion layer 220d may be arranged in the first auxiliary opening 241d, and the second auxiliary color conversion layer 220e may be arranged in the second auxiliary opening 241e. In addition, the first auxiliary filter layer 210d may be between the upper substrate 200 and the first auxiliary color conversion layer 220d, and the second auxiliary filter layer 210e may be between the upper substrate 200 and the second auxiliary color conversion layer 220e.

The first insulating layer 240 included in the display apparatus 1 according to another embodiment may include the first opening 241a and the third opening 241c, and the first opening 241a and the third opening 241c may include the first auxiliary extension portion 242a and the second auxiliary extension portion 242c, respectively. The first color conversion layer 220a may be arranged in the first auxiliary extension portion 242a, and the second color conversion layer 220c may be arranged in the second auxiliary extension portion 242c. In addition, the first filter layer 210a may be between the upper substrate 200 and the first color conversion layer 220a, and the third filter layer 210c may be between the upper substrate 200 and the second color conversion layer 220c.

Therefore, though the sizes of the first to third openings 241a to 241c are different from each other, or the sizes of the first to third emission areas EA1 to EA3 are different from each other, the reflected color formed by external light on the display apparatus 1 when the display apparatus 1 is not driven may be tinged with black without biasing toward a set color.

Although the display apparatus has been mainly described, the disclosure is not limited thereto. For example, methods of manufacturing the display apparatus will also fall within the scope of the disclosure.

According to one or more embodiments, a display apparatus in which color of reflected light formed by reflected external light on the display apparatus is improved may be implemented. The scope of the disclosure is not limited by such aspects and features.

It should be understood that embodiments described herein should be considered in a descriptive sense only and not for purposes of limitation. Descriptions of features or aspects within each embodiment should typically be considered as available for other similar features or aspects in other embodiments. While some embodiments have been described with reference to the figures, it will be understood by those of ordinary skill in the art that various suitable changes in form and details may be made therein without departing from the spirit and scope as defined by the following claims and equivalents thereof.

What is claimed is:

1. A display apparatus comprising:
   a first light-emitting device, a second light-emitting device, and a third light-emitting device arranged on a lower substrate;
   an upper substrate arranged to face the lower substrate and including a first emission area corresponding to the first light-emitting device, a second emission area corresponding to the second light-emitting device, a third emission area corresponding to the third light-emitting device, and a non-emission area, which is an area of the upper substrate other than the first to third emission areas;
   a first insulating layer arranged on the upper substrate and having a first opening corresponding to the first emission area, a second opening corresponding to the second emission area, and a first auxiliary opening corresponding to the non-emission area and located relative to the first opening in a first direction;
   a first color conversion layer arranged in the first opening and including first quantum dots to convert incident light into light of a first color;
   a first auxiliary color conversion layer arranged in the first auxiliary opening and including the first quantum dots to convert incident light into light of the first color; and
   a second insulating layer arranged on the first insulating layer and having a first open portion corresponding to the first opening and the first auxiliary opening.

2. The display apparatus of claim 1, further comprising a transmission layer arranged in the second opening,
   wherein the second insulating layer further has a second open portion that corresponds to the second opening and has an extension portion extending in a second direction and exposing at least a portion of the first insulating layer, the second direction being opposite to the first direction.

3. The display apparatus of claim 2, further comprising:
   a second color conversion layer arranged to correspond to the third emission area and including second quantum dots to convert incident light into light of a second color; and
   a second auxiliary color conversion layer arranged to correspond to the non-emission area and including the second quantum dots to convert incident light into light of the second color,
   wherein the first insulating layer further has a third opening and a second auxiliary opening, the third opening corresponding to the third emission area and having the second color conversion layer located therein, and the second auxiliary opening corresponding to the non-emission area, being located relative to the third opening in the first direction, and having the second auxiliary color conversion layer located therein, and the second insulating layer further has a third open portion corresponding to the third opening and the second auxiliary opening.

4. The display apparatus of claim 3, wherein the first opening and the third opening are each smaller in size than the second opening.

5. The display apparatus of claim 3, wherein the second opening is arranged between the first auxiliary opening and the second auxiliary opening.

6. The display apparatus of claim 3, wherein the first color is red, and the second color is green.

7. The display apparatus of claim 1, further comprising:
a first filter layer between the upper substrate and the first color conversion layer; and
a first auxiliary filter layer between the upper substrate and the first auxiliary color conversion layer.

8. The display apparatus of claim 1, wherein a surface of the first insulating layer exposed by the first open portion has hydrophobicity.

9. The display apparatus of claim 1, wherein at least one selected from among the first insulating layer and the second insulating layer is black or blue.

10. The display apparatus of claim 3, wherein,
on a plane, the first to third openings each have a square shape.

11. The display apparatus of claim 10, wherein extension lines coupling a center of one of the first to third openings to centers of the other two of the first to third openings, respectively, cross each other.

12. The display apparatus of claim 1, wherein the first to third light-emitting devices are to emit light in which blue light and green light are mixed.

13. A display apparatus comprising:
a first light-emitting device, a second light-emitting device, and a third light-emitting device arranged on a lower substrate;
an upper substrate arranged to face the lower substrate and including a first emission area corresponding to the first light-emitting device, a second emission area corresponding to the second light-emitting device, a third emission area corresponding to the third light-emitting device, and a non-emission area, which is an area of the upper substrate other than the first to third emission areas;
a first insulating layer arranged on the upper substrate and having a first opening corresponding to the first emission area, a second opening corresponding to the second emission area, and a third opening corresponding to the third emission area;
a first color conversion layer arranged in the first opening and including first quantum dots to convert incident light into light of a first color; and
a second insulating layer arranged on the first insulating layer and having a first open portion corresponding to the first opening,
wherein the first opening has a first auxiliary extension portion elongated and extending toward the non-emission area along a first direction, and the first open portion has a first extension portion elongated and extending toward the non-emission area along the first direction,
wherein the third opening has a second auxiliary extension portion elongated and extending toward the non-emission area, and the second opening is arranged between the first auxiliary extension portion of the first opening and the second auxiliary extension portion of the third opening.

14. The display apparatus of claim 13, further comprising a transmission layer arranged in the second opening,
wherein the second insulating layer further has a second open portion that corresponds to the second opening and has a second extension portion extending in a second direction and exposing at least a portion of the first insulating layer, the second direction being opposite to the first direction.

15. The display apparatus of claim 14, wherein, on a plane, the second opening has a square shape.

16. The display apparatus of claim 14, further comprising a second color conversion layer arranged to correspond to the third emission area and including second quantum dots to convert incident light into light of a second color,
wherein the third opening has the second color conversion layer located therein,
the second insulating layer further has a third open portion corresponding to the third opening, and
the second auxiliary extension portion extends toward the non-emission area along the first direction, and the third open portion has a third extension portion extending toward the non-emission area along the first direction.

17. The display apparatus of claim 16, further comprising:
a first filter layer between the upper substrate and the first color conversion layer;
a second filter layer between the upper substrate and the transmission layer; and
a third filter layer between the upper substrate and the second color conversion layer.

18. The display apparatus of claim 13, wherein the first to third light-emitting devices are to emit light in which blue light and green light are mixed.

19. The display apparatus of claim 13, wherein, on a plane, the first opening has an "L" shape.

20. A display apparatus comprising:
a first light-emitting device, a second light-emitting device, and a third light-emitting device arranged on a lower substrate;
an upper substrate arranged to face the lower substrate and including a first emission area corresponding to the first light-emitting device, a second emission area corresponding to the second light-emitting device, a third emission area corresponding to the third light-emitting device, and a non-emission area, which is an area of the upper substrate other than the first to third emission areas;
a first insulating layer arranged on the upper substrate and having a first opening corresponding to the first emission area and a second opening corresponding to the second emission area;
a first color conversion layer arranged in the first opening and including first quantum dots to convert incident light into light of a first color; and
a second insulating layer arranged on the first insulating layer and having a first open portion corresponding to the first opening,
wherein the first opening has a first portion corresponding to the first emission area and a first auxiliary extension portion elongated along a first direction and extending toward the non-emission area along the first direction from the first portion of the first opening, and the first open portion has a first portion corresponding to the first portion of the first opening and a first extension portion elongated along the first direction and extending toward the non-emission area along the first direction from the first portion of the first open portion.

* * * * *